United States Patent
Caramma (10) Patent No.: US 10,833,710 B2
(45) Date of Patent: Nov. 10, 2020

(54) BANDWIDTH EFFICIENT FEC SCHEME SUPPORTING UNEVEN LEVELS OF PROTECTION

(71) Applicant: Cisco Technology, Inc., San Jose, CA (US)

(72) Inventor: Marcello Caramma, Binfield (GB)

(73) Assignee: Cisco Technology, Inc., San Jose, CA (US)

( * ) Notice: Subject to any disclaimer, the term of this patent is extended or adjusted under 35 U.S.C. 154(b) by 521 days.

(21) Appl. No.: 15/637,169

(22) Filed: Jun. 29, 2017

(65) Prior Publication Data

US 2019/0007069 A1 Jan. 3, 2019

(51) Int. Cl.
| | | |
|---|---|---|
| *H03M 13/35* | (2006.01) | |
| *H04L 29/06* | (2006.01) | |
| *H03M 13/37* | (2006.01) | |
| *H04L 1/00* | (2006.01) | |
| *H03M 13/15* | (2006.01) | |

(52) U.S. Cl.
CPC ....... *H03M 13/356* (2013.01); *H03M 13/373* (2013.01); *H03M 13/3761* (2013.01); *H04L 1/007* (2013.01); *H04L 1/0013* (2013.01); *H04L 1/0041* (2013.01); *H04L 1/0057* (2013.01); *H04L 65/607* (2013.01); *H04L 65/608* (2013.01); *H03M 13/1515* (2013.01)

(58) Field of Classification Search
CPC .................................................. H04L 65/607
USPC ....................................................... 709/231
See application file for complete search history.

(56) References Cited

U.S. PATENT DOCUMENTS

| 7,751,324 B2 | 7/2010 | Vadakital et al. |
| 9,136,983 B2 | 9/2015 | Watson et al. |
| 9,288,010 B2 | 3/2016 | Luby |
| 2006/0109805 A1* | 5/2006 | Malamal Vadakital ................ H04L 65/607 370/299 |
| 2007/0204196 A1* | 8/2007 | Watson .................. H04L 1/0041 714/751 |

(Continued)

FOREIGN PATENT DOCUMENTS

WO WO-2013067219 A2 5/2013

OTHER PUBLICATIONS

Casner, et al., "Compressing IP/UDP/RTP Headers for Low-Speed Serial Links", Network Working Group—Request for Comments 2508, Feb. 1999, 24 pages, The Internet Society.

(Continued)

*Primary Examiner* — S M A Rahman
*Assistant Examiner* — Emad Siddiqi
(74) *Attorney, Agent, or Firm* — Behmke Innovation Group LLC; Kenneth J. Heywood; Jonathon P. Western (57) ABSTRACT

In one embodiment, a device in a network splits each of a plurality of packets of two or more data streams into an equal number of fragments. The number of fragments for packets of a particular one of the streams controls the level of error correction for that stream. The device generates recovery symbols for the fragments for each of the plurality of packets. Each of the plurality of packets has an equal sum of fragments plus recovery symbols. The device multiplexes the fragments and recovery symbols for each of the packets, to form a set of new packets. The device sends the set of new packets to one or more recipients in the network.

20 Claims, 6 Drawing Sheets

(56) References Cited

U.S. PATENT DOCUMENTS

2010/0169738 A1 7/2010 Wu et al.
2016/0127077 A1 5/2016 Bright-Thomas et al.

OTHER PUBLICATIONS

Lacan, et al., "Reed-Solomon Forward Error Correction (FEC) Schemes", Network Working Group—Request for Comments 5510, Apr. 2009, 28 pages, Internet Engineering Task Force Trust.

Li, A., "RTP Payload Format for Generic Forward Error Correction", Network Working Group—Request for Comments 5109, Dec. 2007, 44 pages, Internet Engineering Task Force Trust.

Perkins, et al., "Guidelines for the Use of Variable Bit Rate Audio with Secure RTP", Internet Engineering Task Force (IETF)—Request for Comments 6562, Mar. 2012, 6 pages, Internet Engineering Task Force Trust.

Shih, Chi-Huang., "Enhancing Packet-level Forward Error Correction for Streaming Video in Wireless Networks", IJCSI International Journal of Computer Science Issues, vol. 9, Issue 5, No. 2, Sep. 2012, 10 pages, IJCSI.

Schulzrinne, et al., "RTP: A Transport Protocol for Real-Time Applications", Network Working Group—Request for Comments 3550, Jul. 2003, 89 pages, The Internet Society.

Tsai, Ming-Fong., "Sub-packet forward error correction mechanism for video streaming over wireless networks", Multimedia Tools and Applications, vol. 47 Issue 1, Mar. 2010, pp. 49-69, Kluwer Academic Publishers.

Watson, et al., "Basic Forward Error Correction (FEC) Schemes", Network Working Group—Request for Comments 5445, Mar. 2009, 19 pages, Internet Engineering Task Force Trust.

Watson, et al., "Forward Error Correction (FEC) Building Block", Network Working Group—Request for Comments 5052, Aug. 2007, 25 pages, Internet Engineering Task Force Trust.

\* cited by examiner

BANDWIDTH EFFICIENT FEC SCHEME SUPPORTING UNEVEN LEVELS OF PROTECTION

TECHNICAL FIELD

The present disclosure relates generally to computer networks, and, more particularly, to a bandwidth efficient FEC scheme supporting uneven levels of protection.

BACKGROUND

It is common in conferencing and other multimedia systems to stream multiple streams of data to a recipient. For example, in an online conference, there may be at least three different media streams: the actual presentation stream (e.g., presentation slides), a video stream (e.g., a webcam feed of the presenter), and an associated audio stream (e.g., the captured voice of the presenter). However, different types of media streams may also have different protection requirements.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

According to one or more embodiments of the disclosure, a device in a network splits each of a plurality of packets of two or more data streams into an equal number of fragments. The number of fragments for packets of a particular one of the streams controls the level of error correction for that stream. The device generates recovery symbols for the fragments for each of the plurality of packets. Each of the plurality of packets has an equal sum of fragments plus recovery symbols. The device multiplexes the fragments and recovery symbols for each of the packets, to form a set of new packets. The device sends the set of new packets to one or more recipients in the network.

In further embodiments, a device in a network may receive a set of new packets that encode a plurality of packets of two or more data streams. The device may determine a fragment length of fragments of the plurality of packets of the two or more data streams used to form the set of new packets. Each of the plurality of packets has an equal sum of fragments plus recovery symbols and the number of fragments for packets of a particular one of the streams controls the level of error correction for that stream. The device subdivides each of the new packets to obtain recovery symbols and the fragments for the plurality of packets of the two or more data streams. The device applies a decoding to the recovery symbols and fragments subdivided from the new packets, to obtain the plurality of packets of the two or more data streams.

Description

A computer network is a geographically distributed collection of nodes interconnected by communication links and segments for transporting data between end nodes, such as personal computers and workstations, or other devices, such as sensors, etc. Many types of networks are available, ranging from local area networks (LANs) to wide area networks (WANs). LANs typically connect the nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), synchronous digital hierarchy (SDH) links, or Powerline Communications (PLC) such as IEEE 61334, IEEE P1901.2, and others. In addition, a Mobile Ad-Hoc Network (MANET) is a kind of wireless ad-hoc network, which is generally considered a self-configuring network of mobile routers (and associated hosts) connected by wireless links, the union of which forms an arbitrary topology.

Figure 1A:
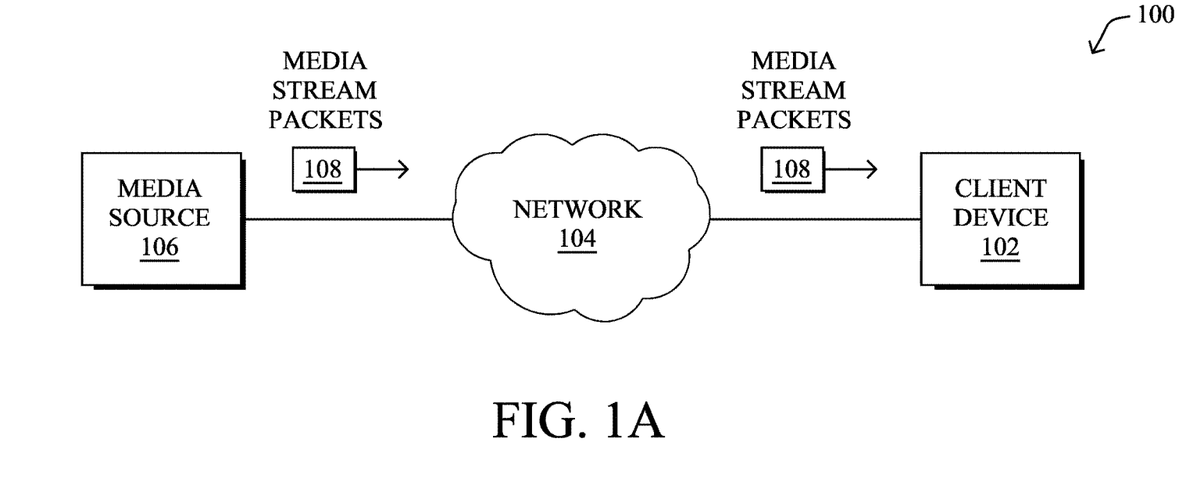
FIGS. 1A-1B illustrate examples of a communication network.

FIG. 1A illustrates an example computer system 100, according to various embodiments of the present disclosure. As shown, a client device 102 may be in communication with a media source device 106 via one or more computer networks 104. Media source device 106 provides media stream packets 108 through network(s) 104 to client device 102. As will be appreciated, network(s) 104 may include, but are not limited to, local area networks (LANs), wide area networks (WANs), the Internet, cellular networks, infrared networks, satellite networks, or any other form of data network configured to convey data between computing devices. Further, while media streaming is used herein to describe the techniques herein, this is but one use case and the techniques can also be used for other types of data streams in further embodiments.

Network(s) 104 may include any number of wired or wireless links between client device 102 and media source device 106. Example wired links may include, but are not limited to, fiber optic links, Ethernet-based links (e.g., Category 5/5e cabling, Category 6 cabling, etc.), digital subscriber line (DSL) links, coaxial links, T carrier links, E carrier links, combinations thereof, or the like. Example wireless links may include, but are not limited to, near field-based links, WiFi links, satellite links, cellular links, infrared links, combinations thereof, or the like.

Client device 102 may be of any form of electronic device operable to communicate via network(s) 104. For example, client device 102 may be a desktop computer, a laptop computer, a tablet device, a smartphone, a wearable electronic device (e.g., a smart watch, a head up display, etc.), a smart television, a set-top device for a television, etc.

In general, client device 102 may be operable to receive media stream packets 108 and render the received content data on an electronic display. For example, client device 102 may execute a media streaming application that, when executed by client device 102, is configured to request streamed media, such as streaming video, audio, or both. In various embodiments, the media streaming application may be a stand-alone application or, alternatively, may be another form of application that is operable to render and display streaming media (e.g., a mobile application, etc.).

As shown in FIG. 1A, client device 102 may send a media streaming request to media source device 106 through network(s) 104. In response to receiving the request, media source device 106 may send media streaming packets 108 to client device 102 through network(s) 104. The client device may repeat the above process any number of times with the same or different media source devices, depending on the contents of streaming media.

As would be appreciated, while FIG. 1A depicts media source device 106 sending media stream packets 108 to client device 102, some implementations may also provide for client device 102 to send media stream packets 108 in the opposite direction, as well. For example, in the case of an online conference, client device 102 may send locally-captured audio and/or video to media source device 106. Said differently, while client device 102 may act as a client with respect to media source device 106, client device 102 may also act as its own media source device, in some embodiments.

Figure 1B:
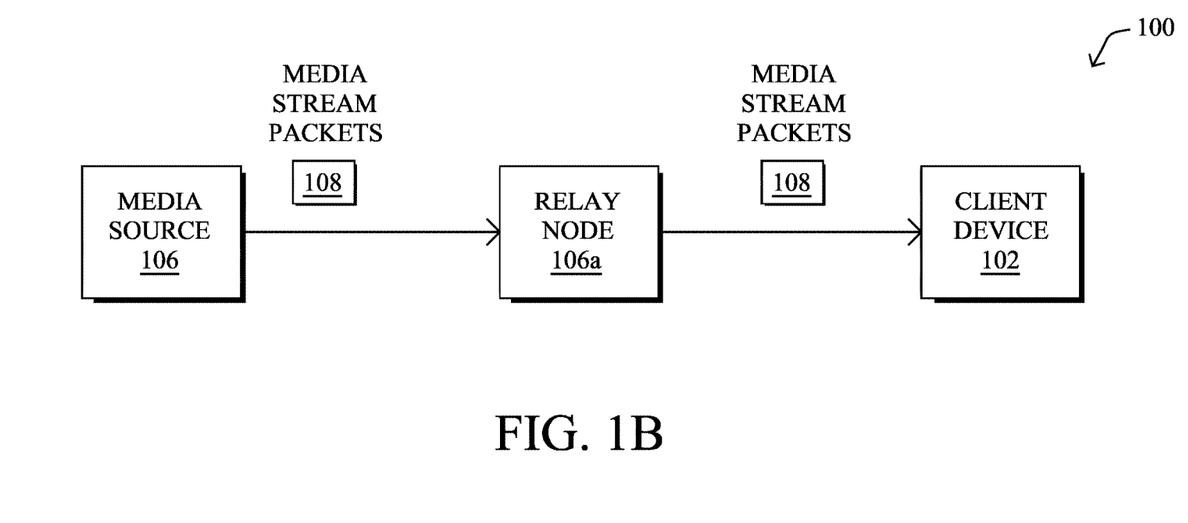

FIG. 1B illustrates another potential configuration for communication network 100, in a further example. In this example, rather than media source 106 sending media stream packets 108 directly to client device 102 via network 104, media source 106 may instead send media stream packets 108 to a relay node 106a. For example, relay node 106a may be part of a cloud-based service, such as a conferencing service or the like. Thus, in some cases, relay node 106a may itself be a media source from the perspective of client device 102 and may combine streams from any number of originators (e.g., audio, video, presentation, etc.).

Figure 2:
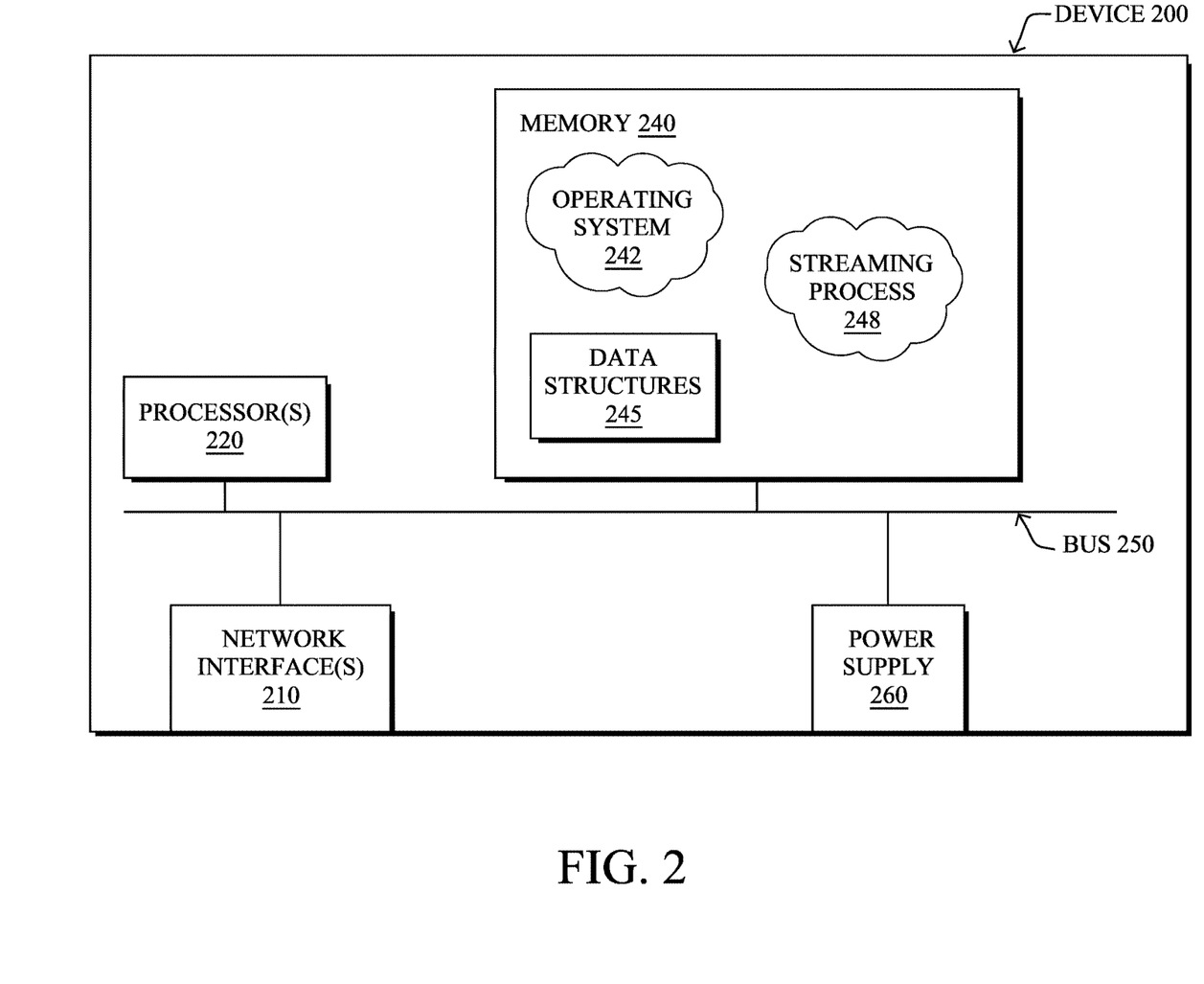
FIG. 2 illustrates an example network device/node.

FIG. 2 is a schematic block diagram of an example node/device 200 that may be used with one or more embodiments described herein, e.g., as any of the nodes shown in FIG. 1 above. In particular, device 200 may be client device 102 or media source device 106. The device may comprise one or more network interfaces 210 (e.g., wired, wireless, etc.), at least one processor 220, and a memory 240 interconnected by a system bus 250, as well as a power supply 260 (e.g., battery, plug-in, etc.).

The network interface(s) 210 contain the mechanical, electrical, and signaling circuitry for communicating data to network 104. The network interfaces may be configured to transmit and/or receive data using a variety of different communication protocols. Note, further, that the nodes/devices may have two different types of network connections 210, e.g., wireless and wired/physical connections, and that the view herein is merely for illustration.

The memory 240 comprises a plurality of storage locations that are addressable by the processor 220 and the network interfaces 210 for storing software programs and data structures associated with the embodiments described herein. Note that certain devices may have limited memory or no memory (e.g., no memory for storage other than for programs/processes operating on the device and associated caches). The processor 220 may comprise hardware elements or hardware logic adapted to execute the software programs and manipulate the data structures 245. An operating system 242, portions of which is typically resident in memory 240 and executed by the processor, functionally organizes the device by, inter alia, invoking operations in support of software processes and/or services executing on the device. These software processes and/or services may include streaming process 248, as described herein.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process). Further, while the processes have been shown separately, those skilled in the art will appreciate that processes may be routines or modules within other processes.

As noted above, streaming media for a client media session may include multiple streams of different media. For example, a media stream may include both a video stream and a corresponding audio stream. Another example may be a media stream from a cloud-based conferencing system that relays media from different conferencing sessions. Other examples of different types of such data streams may include streams of reference video frames, disposable video frames, discontinuations or long periods of voice audio, and the like.

In general, forward error correction (FEC) is a mechanism that attempts to protect network communications from errors and losses/erasures. In particular, FEC allows a sender to encode a communication in such a way that if portions/packets of the communication are lost during transmission, the receiver is still able to reconstruct the original message. In the context of media streaming, FEC is often used, due to the timing constraints involved. For example, the requirements of media streams are often such that it would be impossible for the receiver to request retransmission of a lost packet, while still presenting the lost data to the user in time.

Typically, media streams (e.g., audio, video, presentation, etc.) are protected by FEC independently and sent as separate streams through the network. In contrast, according to various embodiments, the sender may combine the media streams into a unified media stream and apply encoding across the aggregated media streams, thereby improving FEC efficiency (e.g., reducing FEC redundancy, etc.).

Figure 3:
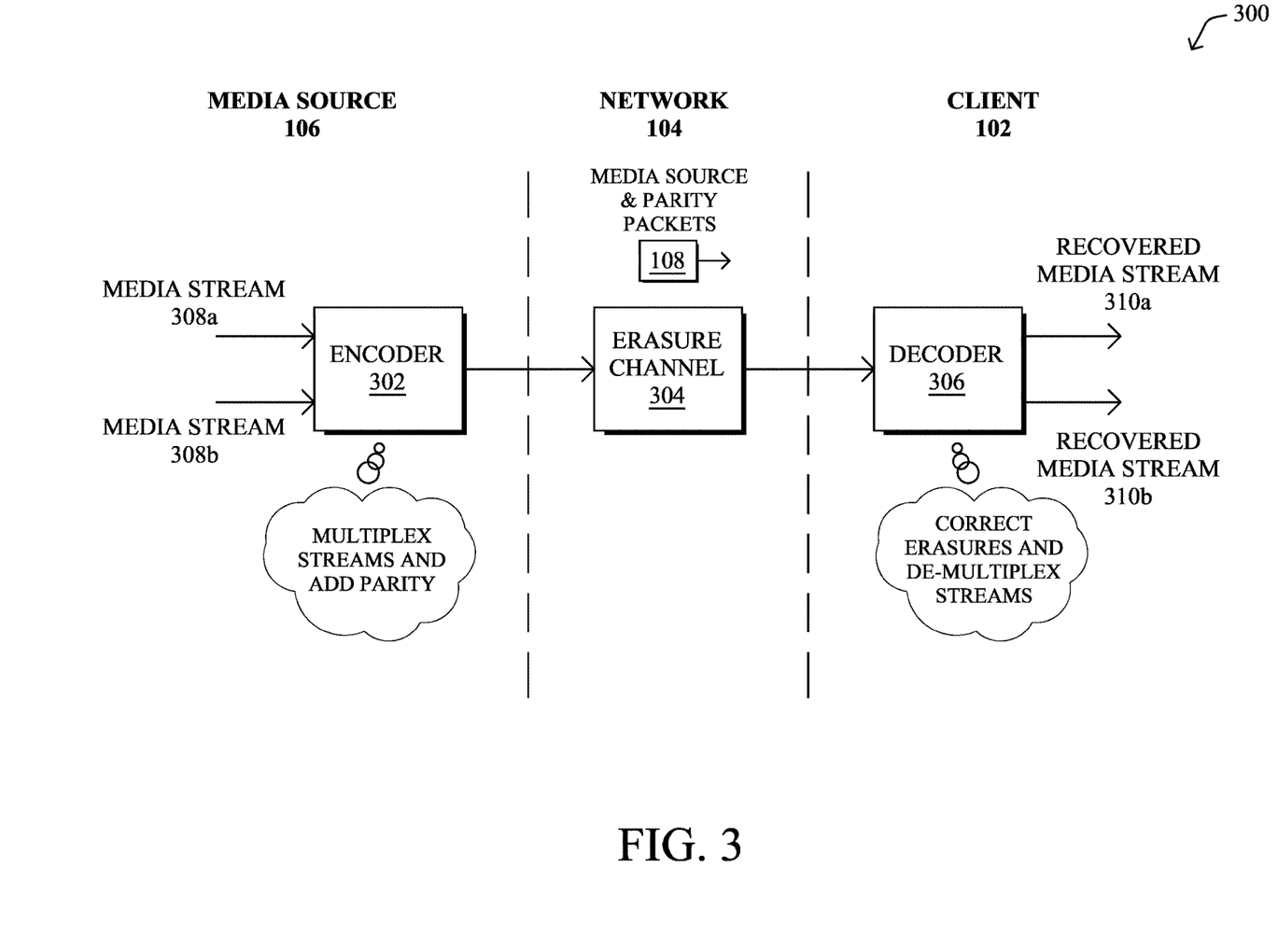
FIG. 3 illustrates an example forward error correction (FEC) mechanism for a media stream.

Operationally, FIG. 3 illustrates an example forward error correction (FEC) mechanism 300 for a media stream, in accordance with the embodiments herein. Continuing the example of FIG. 1, media source 106 may execute an encoder 302 and client device 102 may execute a corresponding decoder 306, both of which may be sub-processes of a media streaming application (e.g., streaming process 248). In further embodiments, media source 106 may itself be a relay node, such as relay node 106a shown in FIG. 1B.

In various embodiments, encoder 302 may apply FEC encoding to any number of source media streams, such as media streams 308a-308b shown. For purposes of simplicity, the techniques herein are described with respect to multiplexing two media streams. However, as would be appreciated, the techniques herein can be applied similarly to any number of multiplexed data streams or even a single data stream.

As a result of the multiplexing and FEC encoding by encoder 302, media source 106 may send packets 108 to client device 102 via network 106 that include the source and parity information needed by client device 102 to recover the original media streams 308a-308b. In particular, media source 106 may send packets 108 via a so-called "erasure" channel 306 in network 104 that derives its name from the fact that packets 108 may be dropped/erased during transmission to client device 102. More generally, however, channel 306 may be any form of communication channel in the network and the techniques herein may also be applied to channels in which no actual erasures occur (e.g., channels that experience delays, etc.).

Client device 102 may receive packets 108 and process packets 108 using decoder 306, to produce recovered media streams 310a-310b. Ideally, recovered media streams 310a-310b will be identical to media streams 308a-308b. However, packet losses along channel 304 may result in the loss of some information during transit. Accordingly, decoder 306 may operate to correct for erasures/losses along erasures channel 304 by identifying packets that did not reach decoder 306 within the expected time and recovering lost data using the parity packets that decoder 306 actually receives. In turn, decoder 306 may provide the recovered media streams 310a-310b to the corresponding processes/devices for presentation of the media to the user of client device 102 (e.g., via a display, speaker, etc.). In further case, streams 308a-308b may be sent to client device 102 via a relay node, such as the case illustrated in FIG. 1A.

Bandwidth Efficient FEC Scheme Supporting Uneven Levels of Protection

The techniques herein introduce a bandwidth efficient FEC scheme that supports uneven levels of protection across multiple data or media streams. In some aspects, Reed-Solomon error correction can be applied to each packet independently by splitting each packet into the same number of encoding symbols (e.g., packet fragments and recovery symbols). In further aspects, the resulting encoding symbols from each packet may be multiplexed, to form new packets for transmission. In doing so, this affords the multiple streams different levels of protection within a single, aggregated stream.

Specifically, according to one or more embodiments of the disclosure as described in detail below, a device in a network splits each of a plurality of packets of two or more data streams into fragments. The number of fragments for packets of a particular one of the streams controls the level of error correction for that stream. The device generates recovery symbols for the fragments for each of the plurality of packets. Each of the plurality of packets has an equal sum of fragments plus recovery symbols. The device multiplexes the fragments and recovery symbols for each of the packets, to form a set of new packets. The device sends the set of new packets to one or more recipients in the network.

Illustratively, the techniques described herein may be performed by hardware, software, and/or firmware, such as in accordance with the streaming process 248, which may include computer executable instructions executed by the processor 220 (or independent processor of interfaces 210) to perform functions relating to the techniques described herein.

Figure 4A:
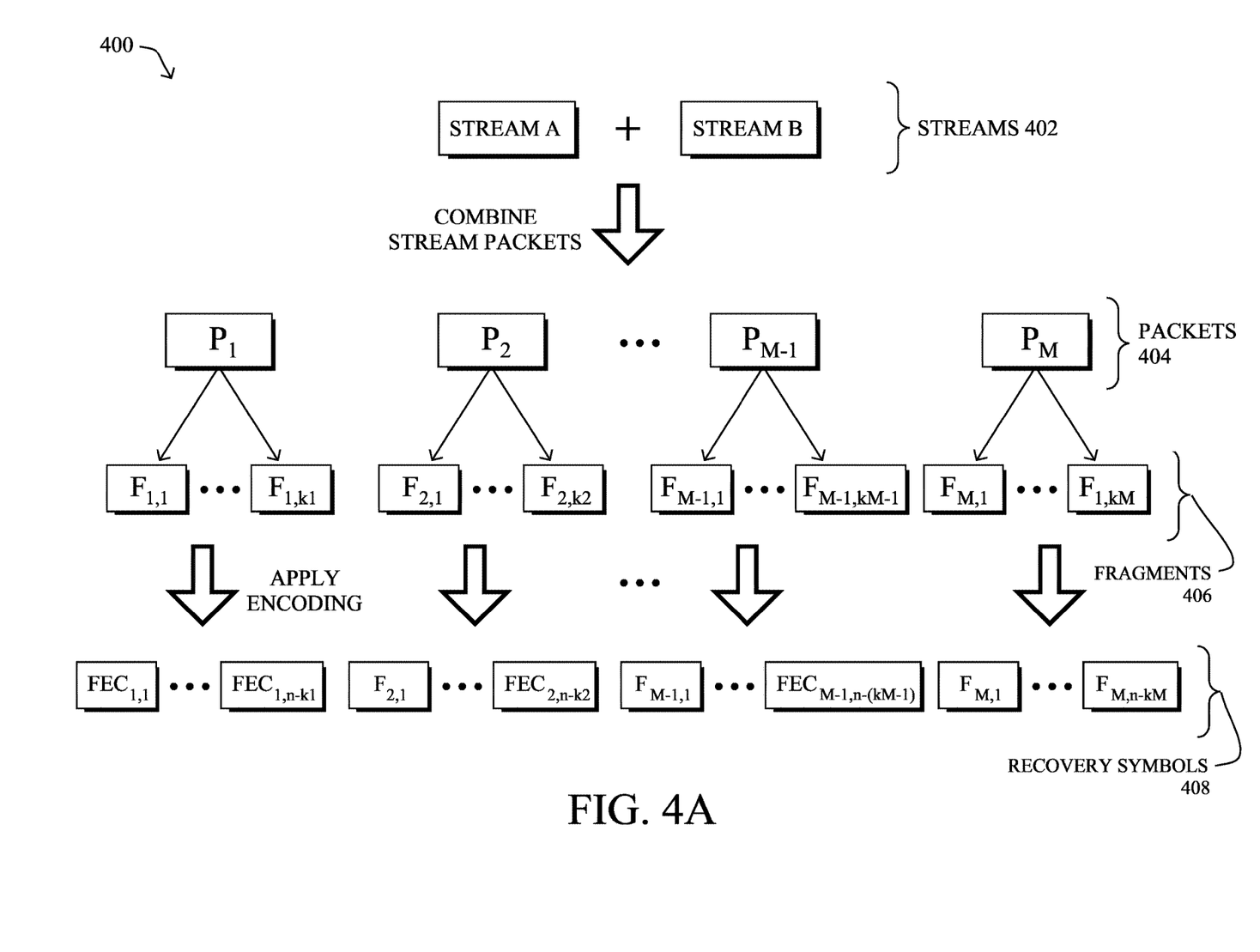
FIGS. 4A-4B illustrates an example of an FEC scheme supporting uneven levels of protection.
Figure 4B:
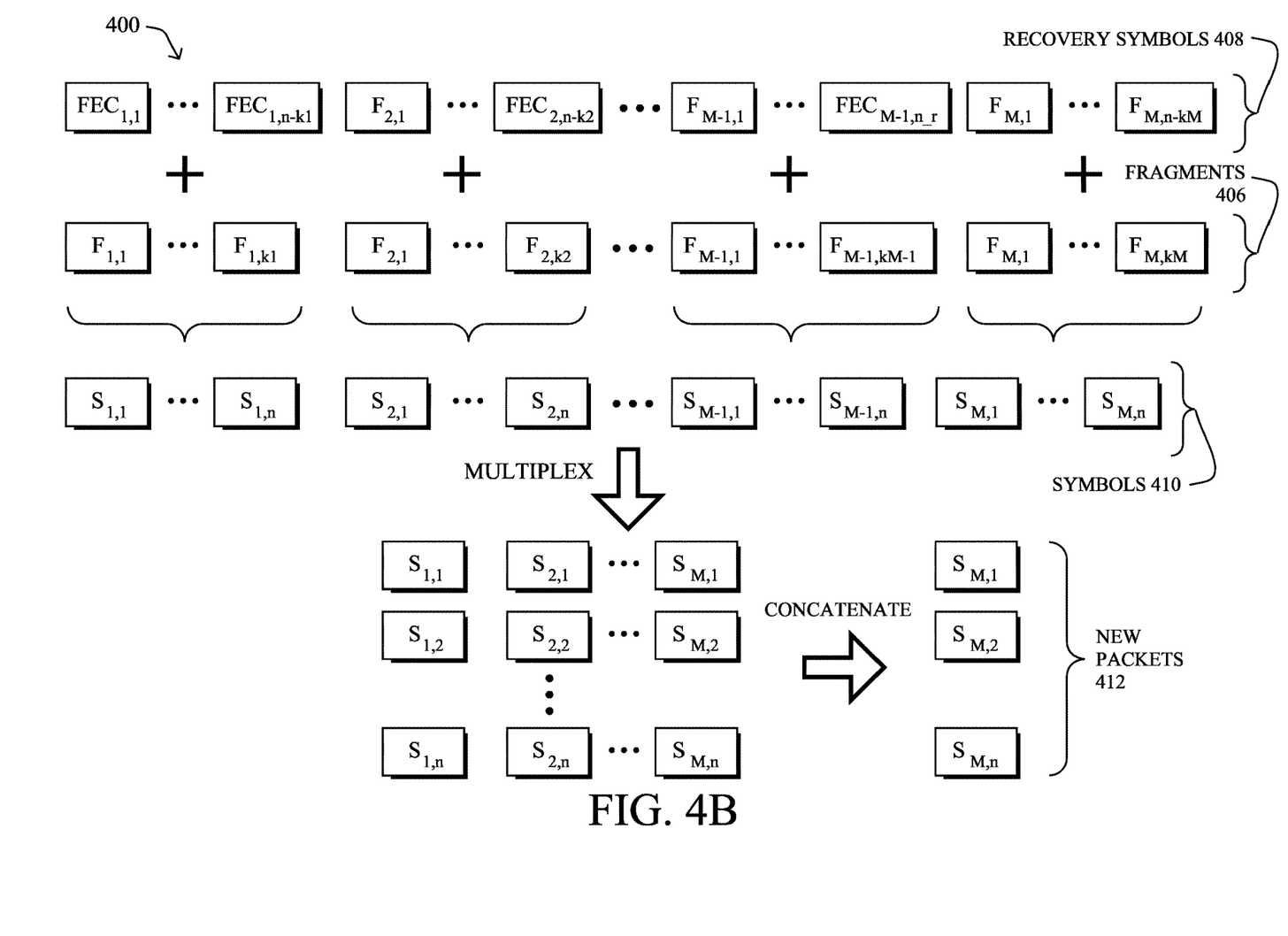

Operationally, FIGS. 4A-4B illustrates an example of an FEC scheme 400 supporting uneven levels of protection, according to various embodiments. As shown, consider the case in which a sender, such as media source 106, is to encode and send packets of two or more data streams 402 to one or more recipients in the network (e.g., client 102). For example, a first data stream 402 may be a video stream (e.g., 'Stream A') and a second data stream 402 may be an audio stream (e.g., 'Stream B'). As would be appreciated, the FEC scheme described herein can be applied to any number of data streams of varying types.

More specifically, as shown, assume that there are M-number of packets 404 in streams 402 that are to be encoded by the encoder of the sending device. In various embodiments, the device may split each packet i into $k_i$ equal fragments 406 (e.g., source symbols). For example, packet $P_1$ may be split into fragments $F_{1,1}$ through $F_{1,k1}$, packet $P_2$ may be split into fragments $F_{2,1}$ through $F_{2,k2}$, etc., up to packet $P_M$ which is split into fragments $F_{M,1}$ through $F_{M,kM}$. In various embodiments, the selection of $k_i$ (e.g., the number of fragments per packet) for each of the streams may control the level of error correction that the stream will receive.

After splitting the packets 404 into fragments 406, the device may apply an error correction mechanism to the fragments 406, to generate a set of recovery symbols 408. More specifically, the encoder may generate n-$k_i$ recovery symbols from the $k_i$ fragments 406 for each of the packets 404, where n is selected as the total number of new packets to be sent to the recipients.

In combination with fragments 406, recovery symbols 408 are sufficient to recover the whole packets 404 when received by the recipients. As a result of the encoding, each of packets 404 may have n-$k_i$ number of recovery symbols 408. In other words, the sum of the number of fragments plus recovery symbols for any given packet 404 will be equal for each of the M-number of packets.

The encoding of fragments 406 can be expressed in pseudocode as follows:

Input:
Packet$_i$=Fragment$_{i,1}$|Fragment$_{i,2}$| . . . |Fragment$_{i,ki}$
// Note: "|" represent concatenation in the above
Output:
{FEC$_{i,1}$, FEC$_{i,2}$, . . . , FEC$_{i,n-ki}$}=FEC_Encode (Fragment$_{i,1}$, Fragment$_{i,2}$, . . . , Fragment$_{i,ki}$ $k_i$, n)

where FEC_Encode( ) can be any form of FEC encoding mechanism, such as Reed-Solomon, a multi-stream encoding mechanism, or any other invertible encoding function that allows for the recovery of the $k_i$ fragments 406 of any of the given packets 404 from any $k_i$ symbols in the sent set of symbols {Fragment$_{i,1}$, Fragment$_{i,2}$, . . . , Fragment$_{i,ki}$, FEC$_{i,1}$, FEC$_{i,2}$, . . . , FEC$_{i,n-ki}$}.

For simplicity, as shown in FIG. 4B, the resulting n-number of symbols 410 to be sent to the recipient(s) may be denoted as follows:

{$s_{i,1}$, $s_{i,2}$, . . . , $s_{i,n}$}={Fragment$_{i,1}$, Fragment$_{i,2}$, . . . , Fragment$_{i,ki}$, FEC$_{i,1}$, FEC$_{i,2}$, . . . , FEC$_{i,n-ki}$}

This operation can be repeated for all of i=1 . . . M original stream packets 404. If the total number of encoding symbols is chosen so that $n_i$=n for i=1 . . . M, this will result in M-number sets of symbols 410 for transmission:

{$s_{1,1}$, $s_{1,2}$, . . . , $s_{1,n}$} // fragments plus associated FEC for packet 1
{$s_{2,1}$, $s_{2,2}$, . . . , $s_{2,n}$} // fragments plus associated FEC for packet 2
. . .
{$s_{M,1}$, $s_{M,2}$, . . . , $s_{M,n}$} // fragments plus associated FEC for packet M Also as shown in FIG. 4B, the sets of symbols 410 (e.g., packet fragments plus recovery symbols) can be multiplexed (e.g., rearranged) and concatenated in an interleaved fashion to form the payloads of a set of new packets 412:

$z_1$=$s_{1,1}$|$s_{2,1}$| . . . |$s_{M,1}$
$z_2$=$s_{1,2}$|$s_{2,2}$| . . . |$s_{M,2}$
[ . . . ]
$z_n$=$s_{1,n}$|$s_{2,n}$| . . . |$s_{M,n}$

Note that this arrangement is possible because the same n-number encoding symbols 410 (media fragments and recovery symbols) for each packet 404.

It is to be noted that in this arrangement:
1. The number of payloads generated is equal to the number of encoding symbols, n, which is the same for each packet 404 (e.g., the number of fragments plus recovery symbols for the packet).
2. The number of packets 404 being interleaved does not affect the level of protection of each packet 404, which is only affected by ki and n.
3. The last fragment 406 of each packet 404 may be padded with zeros, in order to generate the recovery symbols 408, but there is no requirement for the padding to be included in the generation of the payloads of new packets 412. In addition, the amount of padding will always be smaller than the size of a fragment 406.
4. Because each packet 404 is split in fragments 406 all of the same length, the length of each payload of a new packet 412 is approximately the same for all new packets 412. Note that if padding is included for the last media packet 404, the lengths of each payload of new packets 412 will be exactly the same.
5. Although the scheme requires n to be the same for all packets 404 in a block, the number of fragments (ki) and, consequently, the number of recovery symbols (n-ki), can be adjusted, to vary the level of error correction afforded to those packets, as desired.

Thus, the above encoding techniques provide for unequal amounts of protection from errors across the different streams that are combined. For example, assume there are packets A, B, C from three different streams whereby A is to receive a high level of protection, B is to receive a moderate amount of protection, and C is to be left unprotected. Further, assume that four packets are to be generated to achieve these requirements, namely A', B', C', D', with a 25% FEC overhead in total. In such a case, the above techniques can be applied as follows:
1. Split the packets A, B, C into equal parts (bigger parts for the ones to be protected the most): $A=A_1|A_2$; $B=B_1|B_2|B_3$; $C=C_1|C_2|C_3|C_4$
2. Apply Reed-Solomon FEC to each packet independently, so as to always make a total of 4 symbols between media and FEC:
   1. $(A_3, A_4)=FEC(n=4, k=2, (A_1, A_2))$
   2. $(B_4)=FEC(n=4, k=3, (B_1, B_2, B_3))$
3. Interleave the FEC blocks to make a packet out of each four:
   1. $A'=A_1|B_1|C_1$
   2. $B'=A_2|B_2|C_2$
   3. $C'=A_3|B_3|C_3$
   4. $D'=A_4|B_4|C_4$ Note that losing just one of the new packets above would mean that the original packet C cannot be recovered, but packets A and B can still be recovered. Losing two of the new packets also means that only packet A can still be recovered. Losing three or more packets means that none of packets A, B, C can be recovered. Thus, each of the streams receives an unequal level of error correction in the combined stream sent to the recipient(s).

The decoding process can be carried out as follows by any of the recipients of the new packets 412 as follows:
Input:
n—the total number of encoding symbols for each original packet
$L_i$—the total length of each original packet
$k_i$—the total number of fragments k for the $i^{th}$ original packet
A subset of the payloads $\{z_1, z_2, \ldots, z_n\}$ Procedure:
1. For each media packet i, calculate the length of each fragment as $fraglen_i=ceil(L_i/k_i)$. This is the length of all encoding symbols for packet i.
2. Calculate the amount of padding added to the last fragment as $pad_i=L_i-k_i*fraglen_i$. This can be used to adjust the length of the last fragment, as shown below.
3. Subdivide each received payload $z_j$ of new packets 412 into M fragments of length $fraglen_1'$, $fraglen_2'$, ..., $fraglen_M'$, respectively, where $fraglen_i'=fraglen_i+ (j==k_i\ ?\ pad_i:\ 0)$. The term in parentheses adjusts the length of the last fragment. This leads to: $z_j=s_{1,j}|s_{2,j}|\ldots|s_{M,j}$
4. Rebuild the original stream packets 404 as follows:
   For i in all packets M:
      if the number of received payload is fewer than $k_i$:
         packet i is not recoverable
      else:
         Packet i=Decode($s_{i,1}'$, $s_{i,2}'$, ..., $s_{i,n}'$)
   // Note $s_{1,x}'$ is null if payload $z_x$ has not been received by the recipient Various embodiments exist to send the values of $L_i$, $k_i$ and n for each packet 404. In one embodiment, an FEC header can be sent with each payload $z_j$ as part of new packets 414 that include the following information: the value of n, the index j=0, ..., n-1, the total number of packets protected M, and an array of M entries each indicating the length of the packet $L_i$ and the number of fragments $k_i$. In such a scheme, the packets could then be sent in a separate RTP stream as follows:

RTP_HDR|[RTP_HDR_EXTENSION]|FEC_HDR$_j$|$z_j$
with
FEC_HDR$_j$=n|j|M|$L_1$|$k_1$|$L_2$|$k_2$ ... |$L_M$|$k_M$
where n, j, M, $L_i$, $k_i$ are encoded in an appropriate format and possibly with a variable length.

In another embodiment, the above information can instead be conveyed to the recipient(s) via a metadata packet (referred to as packet 0), to avoid repeating the information. Such a metadata packet may be created as follow:
Packet0=M|$L_1$|$k_1$|$L_2$|$k_2$ ... |$L_M$|$k_M$
Packet0 is fragmented using $k_0=min_i(k_i)$, so that the metadata packet is protected as well as the best protected packet in the set. The fragments of this metadata packet (and associated recovery symbols) will always appear at the beginning in the payload (after interleaving):
$z_j=s_{j,0}|s_{j,1}|s_{j,2}|\ldots|s_{j,M}$
In this scheme, the FEC header will only include enough information to extract the metadata packet (which can be recovered first): FEC_HDR$_j$=n|j|$L_0$|$k_0$.

Further embodiments also provide for the conveyance of additional information via the metadata packet. For example, RTP header information, and potentially header extensions, could also be included in the metadata packet, in some embodiments. This has at least two advantages:
1. It is sensible to want to protect more the RTP header of a packet than the rest of the payload.
2. It allows the RTP headers in the metadata packets to be compressed, which is particularly useful if many packets with the same SSRC are to be protected together.

Figure 5:
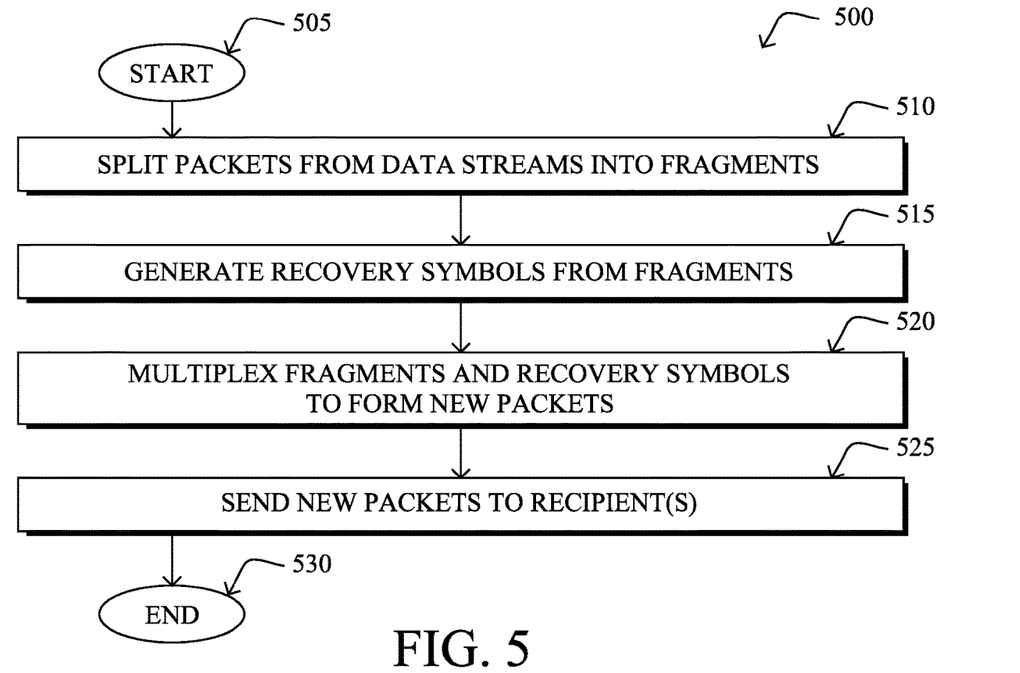
FIG. 5 illustrates an example simplified procedure for encoding multiple data streams with uneven levels of protection.

FIG. 5 illustrates an example simplified procedure for encoding multiple data streams with uneven levels of protection in a network, in accordance with one or more embodiments described herein. For example, a non-generic, specifically configured device (e.g., device 200) may perform procedure 500 by executing stored instructions (e.g., process 248). The procedure 500 may start at step 505, and continues to step 510, where, as described in greater detail above, the device may split each of a plurality of packets of two or more data streams into fragments. In various embodiments, the number of fragments for packets of a particular one of the streams controls the level of error correction for that stream. For example, the data streams may comprise multimedia streams (e.g., video, audio, etc.). Unequal levels of protection can also be applied to different ones of the streams through selection of the number of fragments used for each of the packets of a given stream. For example, long term reference frames, a stream of a burst of speech audio, a stream of a discontinuation of speech audio, or other important packets may be given a greater level of error correction (e.g., protection) than less important packets, such as disposable frames.

At step 515, as detailed above, the device may generate recovery symbols from the fragments. For example, the device may apply Reed-Solomon FEC encoding or another selected FEC encoding, to generate the recovery symbols. In various embodiments, each of the plurality of packets has an equal sum of fragments plus recovery symbols. For example, if a packet is split into a lower number of fragments, it may receive a higher number of recovery symbols, thereby increasing its level of protection. Conversely, if packets of a given stream are split into a high number of fragments, they may receive a low number of recovery symbols or even no recovery symbols at all.

At step 520, the device may multiplex the fragments and recovery symbols to form new packets, as described in greater detail above. For example, one of the new packets may include a payload that is the concatenation of fragments and/or recovery symbols across each of the original set of stream packets. In various embodiments, the number of new packets may also be equal to the sum of fragments and recovery symbols for any of the original stream packets.

At step 525, as detailed above, the device may send the new packets to one or more recipients in the network. In turn, the recipient(s) may apply a reverse encoding to the new packets, to obtain the original packets of the two or more data streams. To provide the needed information for this decoding, the device may include information about the encoding process (e.g., the number of fragments per packet, etc.) either in header information of the new packets or, alternatively, via a metadata packet that is also encoded with the packets of the two or more streams. Procedure 500 then ends at step 530.

Figure 6:
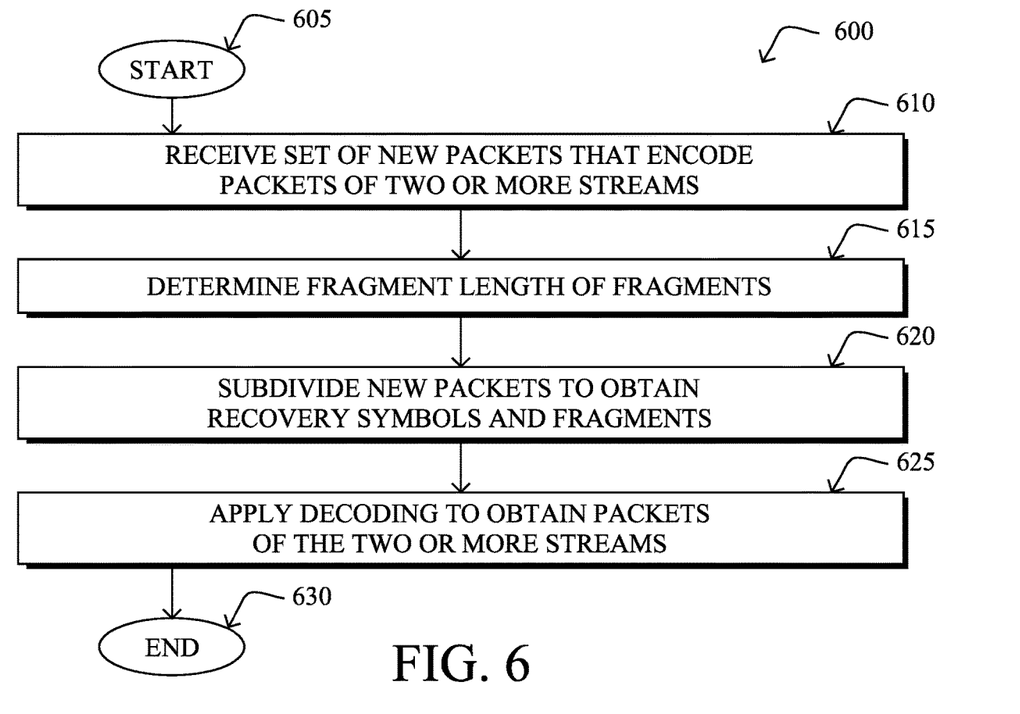
FIG. 6 illustrates an example simplified procedure for recovering data streams from encoded packets.

FIG. 6 illustrates an example simplified procedure for recovering data streams from encoded packets in a network, in accordance with various embodiments herein. For example, a non-generic, specifically configured device (e.g., device 200) may perform procedure 600 by executing stored instructions (e.g., process 248). The procedure 600 may start at step 605, and continues to step 610, where, as described in greater detail above, the device may receive a set of new packets that encode a plurality of packets of two or more data streams. In other words, the device may be a recipient of a stream of data that encodes two or more streams of data, such as multimedia streams.

At step 615, as detailed above, the device may determine a fragment length of fragments of the plurality of packets of the two or more data streams used to form the set of new packets. In various embodiments, each of the plurality of packets has an equal sum of fragments plus recovery symbols and the number of fragments for packets of a particular one of the streams controls the level of error correction for that stream. The device may determine the fragment length from, e.g., information included in the headers of the new packets or, alternatively, via a metadata packet that carries this information.

At step 620, the device may subdivide each of the new packets to obtain recovery symbols and the fragments for the plurality of packets of the two or more data streams, as described in greater detail above. For example, using the fragment length values, the device may split the payloads of the new packets into any number of symbols that may comprise fragments of the packets of the original two or more data streams and/or recovery symbols.

At step 625, as detailed above, the device may apply a decoding to the recovery symbols and fragments subdivided from the new packets, to obtain the plurality of packets of the two or more data streams. For example, the device may apply an FEC decoding mechanism to the packet fragments and recovery symbols obtained from the new packets, to reconstruct the original packets of the two or more original data streams. Procedure 600 then ends at step 630.

It should be noted that while certain steps within procedures 500-600 may be optional as described above, the steps shown in FIGS. 5-6 are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while procedures 500-600 are described separately, certain steps from each procedure may be incorporated into each other procedure, and the procedures are not meant to be mutually exclusive.

The techniques described herein, therefore, allow for multiple data streams to be encoded into a single stream with unequal levels of error correct/protection. In some aspects, the encoding scheme supports higher bandwidth efficiency by minimizing padding, especially when packets of unequal length are involved. The encoding scheme also supports header compression at various layers and provides a more effective ability to trade-off resilience and latency vs. bandwidth efficiency (e.g., by decoupling the number of source symbols in the encoder from the number of original packets). The techniques can also support different levels of protection for different streams or, in further embodiments, for different packets of the same stream.

In addition, by merging streams into an independent container stream, the new stream is better suited for hop-by-hop termination. This makes the collection of statistics for that stream considerably easier, with no need to aggregate statistics for different ssrcs at the transport layer. Only the stats for this particular stream would matter, and potentially more simple (possibly extended) RTCP reports would be sufficient.

While there have been shown and described illustrative embodiments that provide for encoding and decoding multiple data streams, it is to be understood that various other adaptations and modifications may be made within the spirit and scope of the embodiments herein. For example, while certain embodiments are described herein with respect to using certain types of data streams, these are exemplary only and other types of data streams can be encoded in a similar manner as above. In addition, while certain protocols are shown, such as RTP, other suitable protocols may be used, accordingly.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/RAM/EEPROM/etc.) having program instructions executing on a computer, hardware, firmware, or a combination thereof. Accordingly, this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A method comprising:
splitting, by a device in a network, each of a plurality of packets of two or more data streams into fragments, wherein a number of fragments for packets of a particular one of the streams controls a level of error correction for that stream;
generating, by the device, recovery symbols from the fragments, wherein each of the plurality of packets has an equal sum of fragments plus recovery symbols;
multiplexing, by the device, the fragments and recovery symbols for each of the packets, to form new packets; and
sending, by the device, the new packets to one or more recipients in the network,
wherein a number of the recovery symbols generated for a particular packet of the plurality of packets is equal to a number of the new packets minus a number of the fragments into which the particular packet is split,
wherein the packets of the data stream with the highest level of error correction are split into the lowest number of fragments and have the highest number of generated recovery symbols, and
wherein the one or more recipients in the network decode the new packets to obtain the plurality of packets of the two or more data streams by:
subdividing each of the new packets to obtain the recovery symbols and fragments for the plurality of packets of the two or more data streams; and
applying a decoding to the recovery symbols and fragments subdivided from the new packets, to obtain the plurality of packets of the two or more data streams.

2. The method as in claim 1, wherein the two or more data streams comprise multimedia streams.

3. The method as in claim 2, wherein at least one of the two or more data streams comprises a stream of long term reference frames, a stream of a burst of speech audio, or a stream of a discontinuation of speech audio.

4. The method as in claim 1, wherein splitting each of the plurality of packets of the two or more data streams into an equal number of fragments comprises:
padding, by the device, a last fragment for one of the plurality of packets with zeros.

5. The method as in claim 1, wherein the new packets comprise a number of new packets equal to the sum of recovery symbols plus fragments for any given packet of the two or more data streams.

6. The method as in claim 1, wherein sending the new packets to the one or more recipients in the network comprises:
including, by the device, a header with one or more of the new packets that specifies a count of the plurality of packets of the two or more data streams, one or more index numbers associated with the one or more new packets, a count of the fragments for each of the plurality of packets of the two or more data streams, and an index of packet sizes of the plurality of packets of the two or more data streams.

7. The method as in claim 1, wherein sending the new packets to the one or more recipients in the network comprises:
encoding, by the device, a metadata packet in the new packets that specifies a count of the plurality of packets of the two or more data streams, a count of the fragments for each of the plurality of packets of the two or more data streams, and an index of packet sizes of the plurality of packets of the two or more data streams.

8. The method as in claim 7, wherein the metadata packet further includes Real-time Transport Protocol (RTP) header information from the plurality of packets of the two or more data streams.

9. The method as in claim 7, wherein the one or more recipients in the network decode the new packets to obtain the plurality of packets of the two or more data streams by:
determining a fragment length of the fragments for each of the plurality of packets in the two or more data streams.

10. A method comprising:
receiving, at a device in a network, new packets that encode a plurality of packets of two or more data streams;
determining, by the device, a fragment length of fragments of the plurality of packets of the two or more data streams used to form the new packets, wherein each of the plurality of packets has an equal sum of fragments plus recovery symbols for a particular one of the streams, and wherein a number of fragments for packets of the particular one of the streams controls a level of error correction for that stream;
subdividing each of the new packets to obtain recovery symbols and the fragments for the plurality of packets of the two or more data streams; and
applying a decoding to the recovery symbols and fragments subdivided from the new packets, to obtain the plurality of packets of the two or more data streams,
wherein a number of the recovery symbols generated for a particular packet of the plurality of packets is equal to a number of the new packets minus a number of the fragments into which the particular packet is split, and
wherein the packets of the data stream with the highest level of error correction are split into the lowest number of fragments and have the highest number of generated recovery symbols.

11. The method as in claim 10, wherein the fragment length is included in one or more headers of the new packets.

12. The method as in claim 10, wherein the fragment length is included in metadata packet in the set of new packets.

13. An apparatus comprising:
one or more network interfaces to communicate with a network;
a processor coupled to the network interfaces and configured to execute one or more processes; and
a memory configured to store a process executable by the processor, the process when executed configured to:
split each of a plurality of packets of two or more data streams into an equal number of fragments, wherein a number of fragments for packets of a particular one of the streams controls a level of error correction for that stream;

generate recovery symbols for the fragments for each of the plurality of packets, wherein each of the plurality of packets has an equal sum of fragments plus recovery symbols;

multiplex the fragments and recovery symbols for each of the packets, to form of new packets; and send the new packets to one or more recipients in the network, wherein a number of the recovery symbols generated for a particular packet of the plurality of packets is equal to a number of the new packets minus a number of the fragments into which the particular packet is split, wherein the packets of the data stream with the highest level of error correction are split into the lowest number of fragments and have the highest number of generated recovery symbols, and wherein the one or more recipients in the network decode the new packets to obtain the plurality of packets of the two or more data streams by:
  subdividing each of the new packets to obtain the recovery symbols and fragments for the plurality of packets of the two or more data streams; and
  applying a decoding to the recovery symbols and fragments subdivided from the new packets, to obtain the plurality of packets of the two or more data streams.

14. The apparatus as in claim 13, wherein the two or more data streams comprise multimedia streams.

15. The apparatus as in claim 14, wherein at least one of the two or more data streams comprises a stream of long term reference frames, a stream of a burst of speech audio, or a stream of a discontinuation of speech audio.

16. The apparatus as in claim 13, wherein the apparatus splits each of the plurality of packets of the two or more data streams into an equal number of fragments by:
  padding a last fragment for one of the plurality of packets with zeros.

17. The apparatus as in claim 13, wherein the new packets comprise a number of new packets equal to the number of recovery symbols and fragments for any given packet of the two or more data streams.

18. The apparatus as in claim 13, wherein the apparatus sends the new packets to the one or more recipients in the network by:
  including a header with one or more of the new packets that specifies a count of the plurality of packets of the two or more data streams, one or more index numbers associated with the one or more new packets, a count of the fragments for each of the plurality of packets of the two or more data streams, and an index of packet sizes of the plurality of packets of the two or more data streams.

19. The apparatus as in claim 13, wherein the apparatus sends the new packets to the one or more recipients in the network by:
  encoding a metadata packet in the new packets that specifies a count of the plurality of packets of the two or more data streams, a count of the fragments for each of the plurality of packets of the two or more data streams, and an index of packet sizes of the plurality of packets of the two or more data streams.

20. The apparatus as in claim 19, wherein the metadata packet further includes Real-time Transport Protocol (RTP) header information from the plurality of packets of the two or more data streams.

* * * * *

UNITED STATES PATENT AND TRADEMARK OFFICE
CERTIFICATE OF CORRECTION

PATENT NO. : 10,833,710 B2
APPLICATION NO. : 15/637169
DATED : November 10, 2020
INVENTOR(S) : Marcello Caramma Page 1 of 1

It is certified that error appears in the above-identified patent and that said Letters Patent is hereby corrected as shown below:

In the Specification

Column 8, Line 19, please amend as shown:
// Note $s_i,x'$ is null if payload $z_x$ has not been received by Signed and Sealed this
Ninth Day of February, 2021

Drew Hirshfeld
*Performing the Functions and Duties of the
Under Secretary of Commerce for Intellectual Property and
Director of the United States Patent and Trademark Office*